United States Patent
Lowrey

(10) Patent No.: US 11,443,937 B2
(45) Date of Patent: Sep. 13, 2022

(54) SEMICONDUCTOR ICF TARGET PROCESSING

(71) Applicant: Tyler A. Lowrey, Hamilton, MT (US)

(72) Inventor: Tyler A. Lowrey, Hamilton, MT (US)

(73) Assignee: Innoven Energy LLC, Colorado Springs, CO (US)

( * ) Notice: Subject to any disclaimer, the term of this patent is extended or adjusted under 35 U.S.C. 154(b) by 0 days.

(21) Appl. No.: 15/930,056

(22) Filed: May 12, 2020

(65) Prior Publication Data
US 2021/0358644 A1 Nov. 18, 2021

(51) Int. Cl.
| | |
|---|---|
| *H01L 21/02* | (2006.01) |
| *G21B 1/19* | (2006.01) |
| *B81C 1/00* | (2006.01) |
| *H01L 21/311* | (2006.01) |

(52) U.S. Cl.
CPC .... *H01L 21/02063* (2013.01); *B81C 1/00531* (2013.01); *B81C 1/00539* (2013.01); *G21B 1/19* (2013.01); *H01L 21/02002* (2013.01); *H01L 21/02052* (2013.01); *H01L 21/31144* (2013.01)

(58) Field of Classification Search
CPC ......... H01L 21/02063; H01L 21/31144; H01L 21/02052; H01L 21/02002; B81C 1/00539; B81C 1/00531; G21B 1/19

USPC ................................................ 438/694, 745
See application file for complete search history.

(56) References Cited

U.S. PATENT DOCUMENTS

| | | | | |
|---|---|---|---|---|
| 4,323,420 | A * | 4/1982 | Masnari | G21B 1/19 216/2 |
| 8,058,137 | B1 * | 11/2011 | Or-Bach | H03K 19/0948 438/401 |
| 8,551,846 | B2 * | 10/2013 | Kim | H01L 21/3065 438/300 |
| 2012/0177716 | A1 * | 7/2012 | Ho | A61P 1/04 424/423 |
| 2017/0287572 | A1 * | 10/2017 | Kley | C01B 4/00 |

\* cited by examiner

*Primary Examiner* — Duy Vu N Deo

(57) ABSTRACT

A method of manufacturing a semiconductor ICF target is described. On an n-type silicon wafer a plurality of hard mask layers are etched to a desired via pattern. Then isotropically etching hemispherical cavities, lithographically patterning the hard mask layers, conformally depositing ablator/drive material(s) and shell layer material(s), inserting hollow silicon dioxide fuel spheres in the hemisphere cavities, thermally bonding a mating wafer with matching hemisphere cavities and etching in ethylene diamine-pryrocatechol-water mixture to selectively remove n-type silicon and liberate the spherical targets.

8 Claims, 7 Drawing Sheets

SEMICONDUCTOR ICF TARGET PROCESSING

CROSS-REFERENCE TO RELATED APPLICATIONS

This application claims the benefit of U.S. Provisional Application No. 62/824,179 filed on Mar. 26, 2019, which is incorporated herein by reference.

BACKGROUND

Semiconductor processing includes a series of processes which are performed to manufacture a structure having electrodes or wiring layers, and the like to be connected, on a target substrate by forming semiconductor, insulating, and conductive layers in a predetermined pattern on the target substrate. This series of processes identified herein are as follows: pattern formation; dielectric film formation and planarization; gate formation; and metal deposition; and then testing and assembling the semiconductor wafer.

The pattern formation step includes a sequence of steps as well: film deposition, photoresist coating, exposure, development, etching, and ashing/cleaning. A mono-crystal silicon ingot is cut into individual silicon discs called wafers. The wafers are then polished until they have a flawless, smooth surface. In many processes, a wafer is set in a processing system and then exposed to oxygen at high temperatures to create a layer of silicon oxide on the surface. Next, gases such as silane ($SiH_4$) and ammonia ($NH_3$) are introduced into a chamber to form a silicon nitride top layer by chemical vapor deposition (CVD). Then the wafers are rotated at a high speed as they are covered with a thin and uniform application of a UV-sensitive photoresist coating. The photoresist coating is exposed to ultraviolet light which triggers a chemical reaction. Ultraviolet light irradiates the mask pattern to transfer the pattern onto the photoresist. Next the wafers are uniformly covered with a developing solution, to develop the mask patterns. Portions exposed to light become soluble and thus transfer the mask patterns onto the wafer surfaces, in the case of a positive-type photoresist. While portions unexposed to light become soluble in the case of a negative-type photoresist. The portion of the wafer surface still covered by photoresist remains intact as the other regions are etched away to form the desired pattern. After etching, the photoresist is removed by oxygen plasma and the wafers are cleaned by soaking in chemical solvents to remove any residual photoresist, particles, and impurities on the wafer.

During the next phase, dielectric film formation and planarization, an oxide layer is deposited on the surface of the wafer to form a dielectric film using any one of a number of processes including but not limited to a CVD system. The unevenly deposited film surface is then polished to planarize the surface.

In the third phase, gate formation, an oxide film, nitride treatment and polysilicon film is applied before being lithographically patterned and etched. An ion implantation process, called doping, bombards the silicon wafer with various chemical impurities. Ions are implanted into the silicon wafer, wherein the exposed areas are altered in their ability to conduct electricity. The doped impurities are spread uniformly in the trenches by means of high temperature anneal. After the ion implantation, the surface is planarized by dielectric deposition and polishing.

During the final phase, metal deposition, a lithographic patterning process is implemented to make contact holes. The voids are filled with metal using any one of a variety of processes including but not limited to the CVD process. Excess metal film is polished and any debris is removed. An intermetal dielectric film is deposited on the surface, trenches are cut for wires to be laid and then filled with a metal layer before being polished to a smooth surface; which is repeated until the necessary numbers of wiring layers are formed. The plurality of chips are then formed on a finished wafer.

Lastly, the finished wafer is then tested before being singulated and assembled.

Unless otherwise indicated herein, the materials described in this section are not prior art to the claims in this application and are not admitted prior art by inclusion in this section.

SUMMARY OF THE INVENTION

The present invention relates, in general, to semiconductor device manufacturing, and more particularly to a method useful in the manufacturing of a plurality of individual spherical devices from a wafer of semiconductor material.

Accordingly, it is an object of the present invention to provide a high-volume semiconductor manufacturing process. This allows for parallel processing of a large number of target spheres such as required, for example, for Inertial Confinement Fusion (ICF) targets, increasing manufacturing capacity and greatly decreasing unit cost. The present invention enables many advantages including but not limited to the following. Flexibility for a wide variety of material choices for the ablator/drive and shell regions is enabled by this invention and is highly desirable. Also, a high precision lithographic pattern and film thickness application can be easily controlled.

The present invention utilizes a process for manufacturing a plurality of individual spherical devices from a wafer of semiconductor material, comprising: depositing one or more hard mask layers upon a single-crystal n-type silicon substrate; patterning the hard mask layers with vias using lithography; forming hemispherical cavities using isotropic dry or wet etch of the n-type silicon substrate of said wafer; incorporating a p-type dopant into the surface of the hemispherical cavities; conformally depositing an ablator/drive region onto the surface of the hemispherical cavities; conformally depositing a shell layer region onto the ablator/drive region; and placing hollow silicon dioxide fuel spheres within said shell layer.

| REFERNCE NUMERALS | |
|---|---|
| 100 | Silicon Wafer of N-type Conductivity |
| 102 | Single-Crystal N-type Silicon Substrate |
| 104 | SiO$_2$ Layer |
| 106 | Si$_3$N$_4$ Layer |
| 108 | Cr Layer |
| 202 | Photoresist Pattern |
| 402 | Boron P$^+$ |
| 502 | Ablator/drive region |
| 504 | Shell |
| 506 | Hollow SiO$_2$ Fuel Sphere |
| 600 | Bonded Wafer |

DETAILED DESCRIPTION

Figure 1:
FIG. 1 shows a silicon wafer of n-type conductivity with a plurality of deposited hard mask films.

FIGS. 1-6 show a cross-sectional view of a semiconductor ICF Target manufacturing process by the method according to the invention. FIG. 1 shows a silicon wafer of n-type conductivity 100 with a customizable thickness (ranging from 500 µm to 5 cm) for the single-crystal n-type silicon substrate 102. A plurality of hard mask layers may be deposited on top of the single-crystal n-type silicon substrate 102 such as the silicon dioxide layer 104, silicon nitride layer 106 and followed by a chromium layer 108. The thickness of these layers could range from 200 Å to 100,000 Å.

Figure 2:
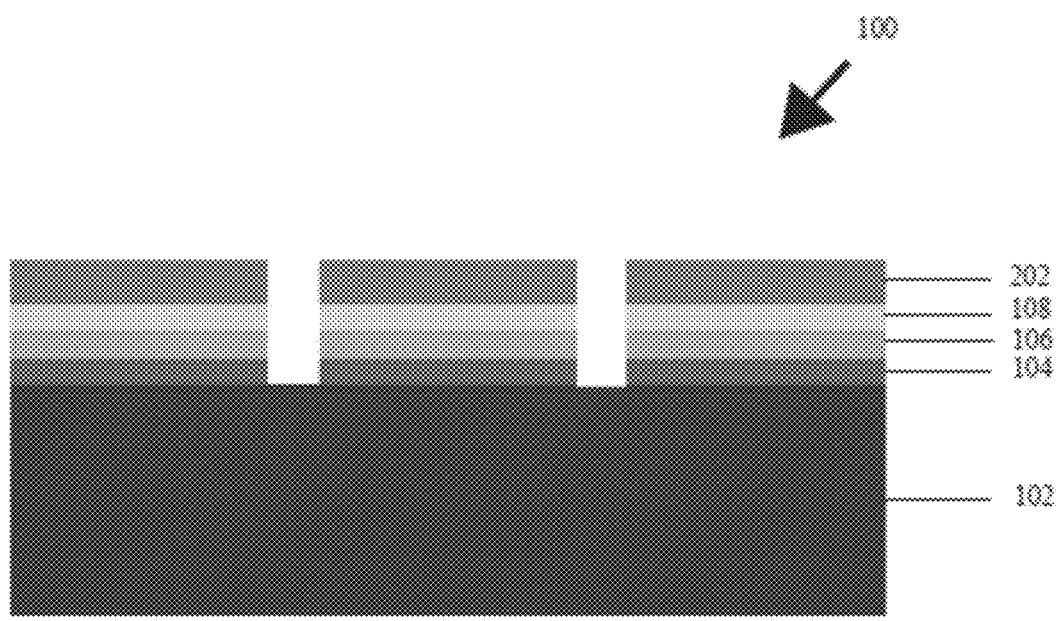
FIG. 2 shows a photoresist coating and etched vias.

As the wafer is rotated at a high speed, a uniform coat of photoresist pattern 202 may then be applied to the surface of the wafer as seen in FIG. 2. Vias may be patterned and etched through one or more adjacent layers until the etching reaches the single-crystal n-type silicon substrate 102. These vias could range in diameter from 1 µm to 1 mm.

Figure 3:
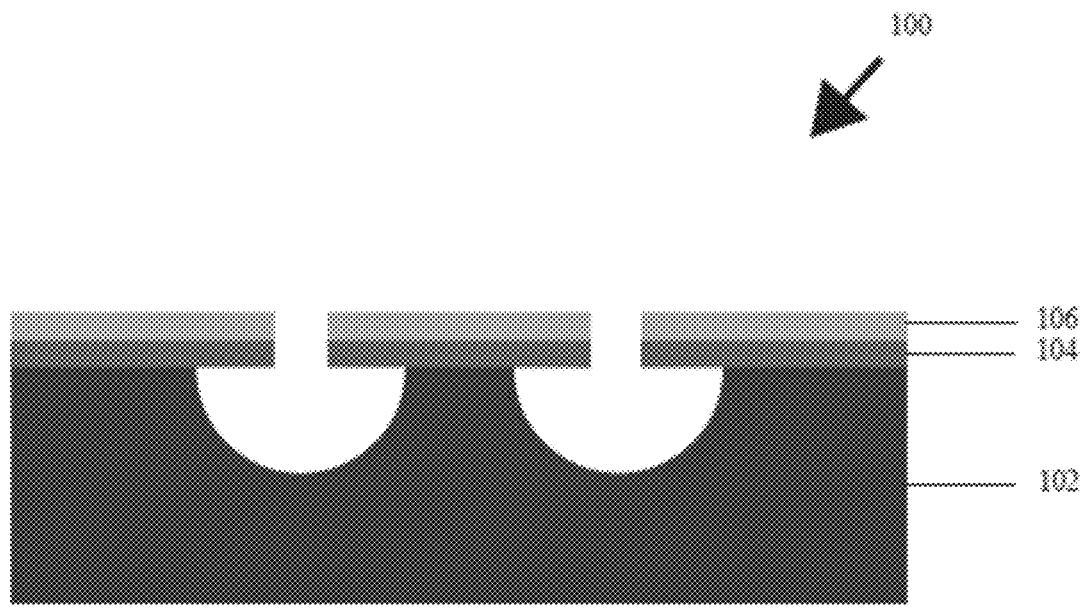
FIG. 3 shows isotropic etched hemispherical cavities.

The photoresist layer may then be chemically stripped by a solvent to reveal a via pattern transferred from the mask. The via hard mask pattern can be used to provide a plurality of hemispherical cavity structures as shown in FIG. 3. This revealed hemispherical cavity pattern is formed by isotropic etching using a sulfur hexafluoride (SF$_6$) dry etch or a silicon wet etch or other suitable isotropic etches. The diameter of these cavities could range from 100 µm to 5 cm. After the etching is complete, the photoresist may then be removed, and the hemispherical cavities become visible. The chromium (Cr) hard mask layer 108 could then be stripped away resulting in FIG. 3. Optionally, one could form a self-aligned flange layer by a controlled undercut of the silicon nitride layer 106 after the isotropic etching of the single-crystal n-type silicon substrate 102. This would allow for the fuel sphere (506, FIG. 5) to have an air-gap between it and the silicon shell (504, FIG. 5) if so desired.

Figure 4:
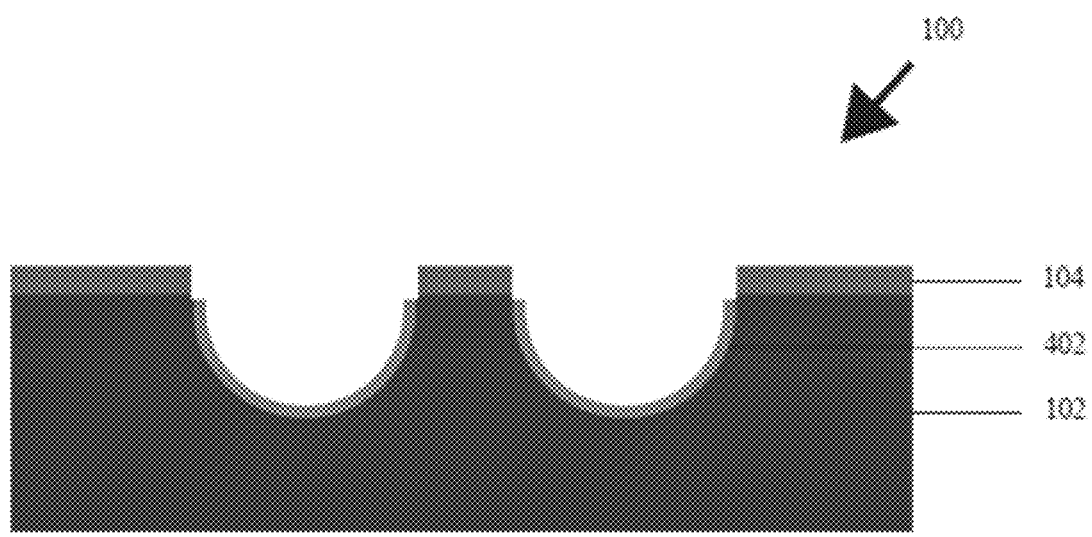
FIG. 4 shows the lithographic patterning of the nitride CMP stop layer.

Optionally a thermal oxidation and strip could be applied to smooth out the surface roughness of the single-crystal n-type silicon substrate 102 on the hemispherical cavity surface. In FIG. 4, a lithographic patterning step may be performed to etch selective regions of the nitride top layer to form the pattern as shown. Then the exposed portion of the silicon surface may be doped with p-type boron to a depth of approximately 1-200 µm using thermally diffuse boron atoms (approximately $5 \times 10^{19}$ cm$^{-3}$ peak doping concentration). In addition, a variety of other materials could be substituted for boron p+ for the freeing etch stop, including but not limited to silicon dioxide. Next the silicon dioxide layer 104 and silicon nitride layer 106 may be chemically stripped away.

Figure 5:
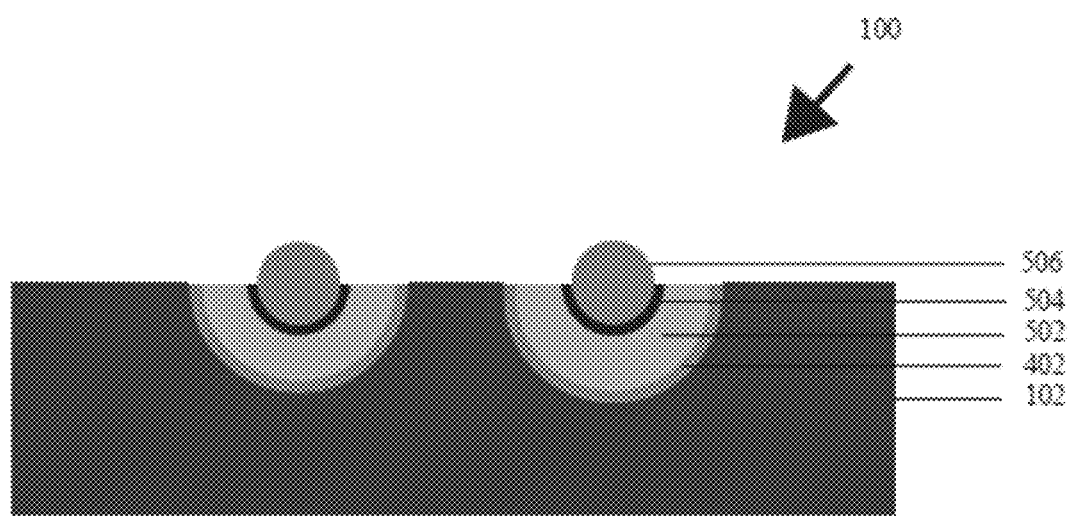
FIG. 5 shows hollow silicon oxide fuel spheres, shell, and ablator/drive region within a single crystal n-type substrate.

Forming an ablator/drive region 502 and shell layers 504 above the p-type boron 402 is shown in FIG. 5. This is done by a conformal deposition of each layer followed by a planarization polish to remove the excess of both layers from the surface. An ablator/drive region in an ICF target is a region that when penetrated by a shock wave, a portion of that ablator layer may be ablated. It can range in thickness from 1 um to 3 cm. Similar thicknesses are possible for the shell layer. While there are many well known methods to polish and remove unwanted layers, using a Chemical Mechanical Planarization (CMP) process is one preferred approach to polish and remove unwanted layers from above the silicon nitride top layer, using the nitride layer as a polish stop 106. Then the silicon nitride layer 106 is stripped away. Optionally a patterned and etched fuel gas diffusion trench can be formed starting from the hemispherical cavity and going through the boron p+ region. A CMP process may be performed again to allow for a flat, smooth mating surface. Hollow silicon dioxide fuel spheres 506 are then placed within the hemispherical cavity.

Alternatively, the ablator/drive and shell material regions could be formed using the silicon dioxide and/or silicon nitride hard masks. Either evaporating a metal flash or depositing a titanium nitride (TiN) layer is then performed to act as a seed layer for electroplating. Excess seed metal is removed from above the silicon nitride layer using CMP. With the hemispherical cavities and silicon electrically conductive and the surface an insulator, electroplating can now be performed biasing the substrate in order to selectively deposit the ablator/drive and shell material regions on the hemispherical cavities.

Figure 6:
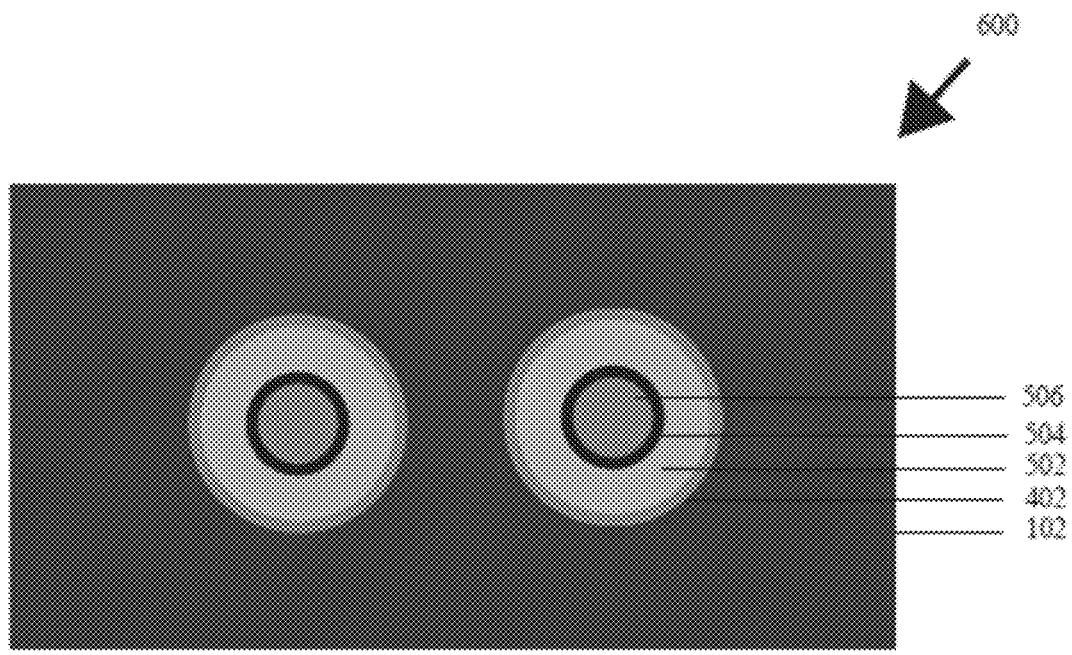
FIG. 6 shows a bonded wafer wherein a second wafer is turned upside down and mated with the original wafer where their flat surfaces are thermally bonded together.

Next, hollow silicon dioxide fuel spheres 506, located in the hemispherical cavities, may be filled with deuterium-tritium (DT) fuel or any one of a variety of other fusion fuel mixtures. A second wafer processed as above, without fuel spheres, is turned upside down and mated with the original wafer and their flat surfaces are thermally bonded together resulting in a bonded wafer 600, as seen in FIG. 6. Optionally, an adhesive layer (not shown) can be applied to one or both of the wafer surfaces to promote adhesion of the two wafers and their hemispheres. The two wafers must be accurately aligned to each other to form spheres from the matching hemispheres, which can be done by forming alignment marks on each and microscope viewed mechanical alignment, as known in the art.

Figure 7:
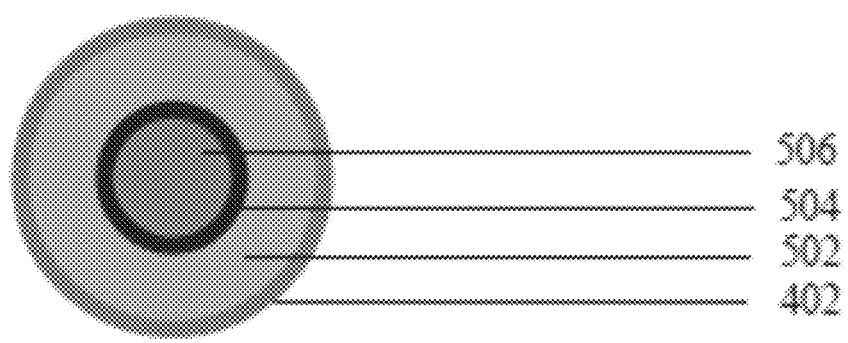
FIG. 7 shows the hollow silicon oxide fuel spheres liberated from the single crystal n-type silicon layer.

FIG. 7 shows what remains after the single-crystal n-type silicon substrate 104 of the mated wafers is selectively removed by etching in an ethylene diamine-pyroccatechol-water mixture. The plurality of target spheres are liberated from the silicon substrates. These target spheres are composed of a hollow silicon dioxide fuel sphere 506 filled with a fusion fuel mixture, surrounded by a shell 504, ablator/drive region 502, and p-type boron doped silicon 402.

There are many advantages for this invention such as parallel processing for thousands of targets on a single wafer, target manufacture at reduced cost, using mature and available semiconductor high volume processing tools and processes, utilizing precision lithography pattern definition, accurate film thickness deposition, and flexibility with ablator/drive region and shell material choices.

Additionally, the set of embodiments discussed in this application is intended to be exemplary only, and not an exhaustive list of all possible variants of the invention. Certain features discussed as part of separate embodiments may be combined into a single embodiment. Additionally, embodiments may make use of various features known in the art but not specified explicitly in this application.

It should be noted that embodiments can be scaled-up and scaled-down in size, and relative proportions of components within embodiments can be changed as well. The range of values of any parameter (e.g. size, thickness, density, mass, composition, etc.) of any component of an embodiment of this invention, or of entire embodiments, spanned by the exemplary embodiments in this application should not be construed as a limit on the maximum or minimum value of that parameter for other embodiments, unless specifically described as such.

The invention claimed is:

1. A process for manufacturing a plurality of individual spherical devices in parallel from a wafer of semiconductor material, comprising:
   creating a first wafer by:
      depositing one or more hard mask films upon a single-crystal n-type silicon substrate;
      applying a uniform coat of photoresist pattern on top of the one or more hard mask films, wherein the first wafer is rotating as the uniform coat of photoresist pattern is applied;
      etching through the one or more hard mask films with vias, wherein the vias range in diameter from 1 µm to 1 mm;
      forming hemispherical cavities using an isotropic dry etch of the n-type silicon substrate having one or more hard mask films, wherein the hemispherical cavities range in diameter from 100 µm to 5 cm;
      using a Chemical Mechanical Planarization (CMP) process to polish and remove one or more of the hard mask films;
      incorporating a p-type dopant on a surface of the hemispherical cavities;
      placing hollow silicon dioxide fuel spheres within the hemispherical cavity; and
      filling the hollow silicon dioxide fuel spheres with a fusion fuel mixture,
   creating a second wafer by repeating the above steps of creating a first wafer, wherein the second wafer has the same pattern of hemispherical cavities as the first wafer;
   mating the first and second wafers together;
   adhesively bonding the first and second wafers together;
   etching to selectively remove what remains from the single-crystal n-type silicon substrate to liberate a spherical device; and
   repeating all of the above steps that produce the plurality of individual spherical devices, in parallel.

2. The process of claim 1, wherein said single-crystal n-type silicon substrate is customized to a thickness ranging from approximately 500 to 5 cm.

3. The process of claim 2, wherein the plurality of hard mask films are composed of one or more of the following materials: silicon dioxide, silicon nitride and chromium.

4. The process of claim 3, wherein the plurality of hard mask films are each customized to a thickness ranging from approximately 200 Å to 100,000 Å.

5. The process of claim 4, further comprising:
   isotropically etching the hemispherical cavities with a sulfur hexafluoride dry etch.

6. The process of claim 5, further comprising:
   using thermally diffuse boron atoms in the p-type doping of the surface of the hemispherical cavity.

7. The process of claim 6, wherein the p-type doping of the surface of the hemispherical cavity is performed to a depth of approximately 1-200 µm for the thermally diffuse boron atoms.

8. The process of claim 7, further comprising;
   conformally depositing a shell layer on top of an ablator/drive layer on top of a surface of the hemispherical cavities; and
   removing any excess from the deposition of shell layer and ablator/drive layer by a planarization polish.

* * * * *